（12）United States Patent
Xu et al.

(10) Patent No.: US 8,052,069 B2
(45) Date of Patent: Nov. 8, 2011

(54) ADVANCED HIGH PERFORMANCE VERTICAL HYBRID SYNTHETIC JET ACTUATOR

(75) Inventors: Tian-Bing Xu, Hampton, VA (US); Xiaoning Jiang, State College, PA (US); Ji Su, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 234 days.

(21) Appl. No.: 12/393,238

(22) Filed: Feb. 26, 2009

(65) Prior Publication Data

US 2010/0044459 A1 Feb. 25, 2010

Related U.S. Application Data

(60) Provisional application No. 61/091,483, filed on Aug. 25, 2008.

(51) Int. Cl.
*B05B 1/08* (2006.01)
(52) U.S. Cl. .................................. 239/102.1; 239/102.2
(58) Field of Classification Search ............. 239/102.1, 239/102.2, 509, 524, 589.1, 596, 601; 310/322, 310/328, 366
See application file for complete search history.

(56) References Cited

U.S. PATENT DOCUMENTS

| 4,850,534 | A | * | 7/1989 | Takahashi et al. | 239/102.2 |
| 5,261,601 | A | * | 11/1993 | Ross et al. | 239/102.2 |
| 5,518,179 | A | * | 5/1996 | Humberstone et al. | 239/102.2 |
| 6,394,363 | B1 | * | 5/2002 | Arnott et al. | 239/102.1 |
| 6,722,581 | B2 | * | 4/2004 | Saddoughi | 239/102.2 |

OTHER PUBLICATIONS

Tian-Bing Xu et al., "Advanced High Performance Synthetic Jet Actuators (HIZMASS) for Active Flow Control in Supersonic Internal and External Viscous Flow", Technical Proposal, National Institute of Aerospace ROA 2006, Hampton Jul. 7, 2006.
Tian-Bing Xu et al., "High Performance, Zero-Net Mass-Flux Actuators (HIZMASS) for Active Control of Viscous Separated Flow on Rotorcraft Vehicles", Technical Proposal, National Institute of Aerospace ROA 2006, Hampton Jul. 7, 2006.

* cited by examiner

*Primary Examiner* — Davis Hwu
(74) *Attorney, Agent, or Firm* — Thomas K. McBride, Jr.; Linda B. Blackburn

(57) ABSTRACT

The present invention comprises a high performance, vertical, zero-net mass-flux, synthetic jet actuator for active control of viscous, separated flow on subsonic and supersonic vehicles. The present invention is a vertical piezoelectric hybrid zero-net mass-flux actuator, in which all the walls of the chamber are electrically controlled synergistically to reduce or enlarge the volume of the synthetic jet actuator chamber in three dimensions simultaneously and to reduce or enlarge the diameter of orifice of the synthetic jet actuator simultaneously with the reduction or enlargement of the volume of the chamber. The jet velocity and mass flow rate for the present invention will be several times higher than conventional piezoelectric synthetic jet actuators.

8 Claims, 7 Drawing Sheets

Figure 2:
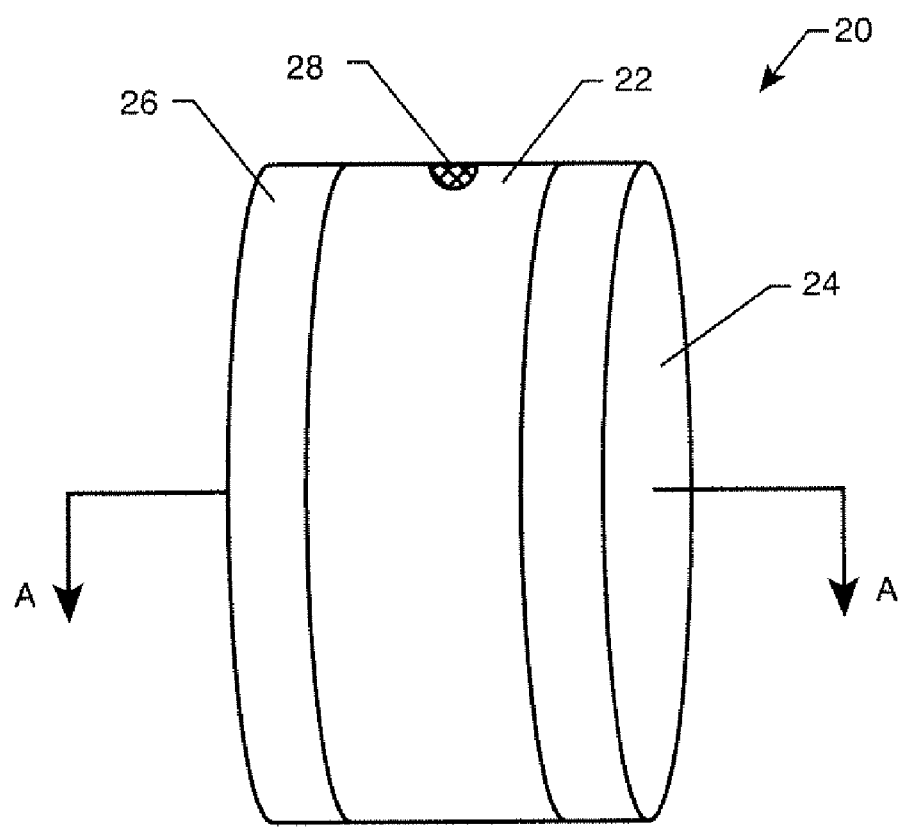

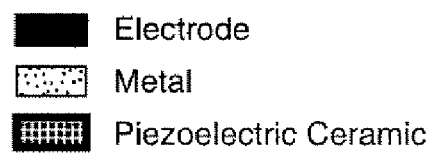
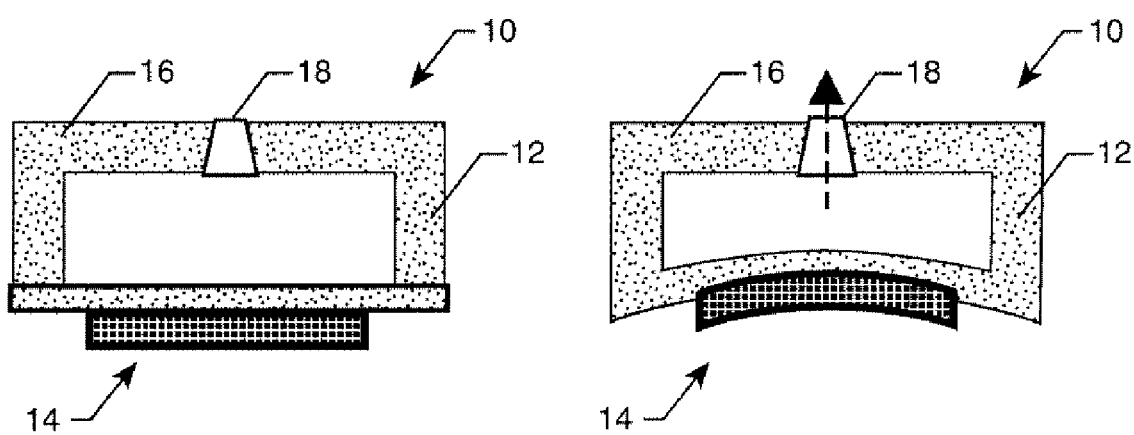
(a) No Voltage Applied    (b) Voltage Applied
(Conventional)
Fig. 1

(a) No Voltage Applied (b) Voltage Applied (a) No Voltage Applied (b) Voltage Applied (a) No Voltage Applied (b) Voltage Applied (c)

US 8,052,069 B2

ADVANCED HIGH PERFORMANCE VERTICAL HYBRID SYNTHETIC JET ACTUATOR

CROSS-REFERENCE TO RELATED APPLICATION

This application is related to U.S. application Ser. No. 12/354,808, filed Jan. 16, 2009, which in turn claims priority to U.S. Provisional Application No. 61/091,510, filed Aug. 25, 2008; and U.S. application Ser. No. 12/355,782, filed Jan. 18, 2009, which in turn claims priority to U.S. Provisional Application No. 61/091,512, filed Aug. 25, 2008, the contents of which are incorporated herein in their entirety.

ORIGIN OF THE INVENTION

The invention was made in part by employees of the United States Government and may be manufactured and used by or for the Government of the United States of America for governmental purposes without the payment of any royalties thereon or therefor.

FIELD OF THE INVENTION

The present invention relates generally to synthetic jet actuators and, more particularly, relates to synthetic jet actuators with multiple electroactive components.

BACKGROUND OF THE INVENTION

Active flow control changes the paradigm of aerodynamic design of current and future wing-borne systems in subsonic, transonic and supersonic flow. Active flow control should be an inherent input to the conceptual design of the next generation of commercial and military flight vehicles. Retrofitted to current fixed-wing aircraft, active flow control can "clean up" complex three-dimensional, external flow separations on the wing top surface particularly severe under maneuvering conditions. Active flow control can inhibit flow distortion at the compressor face in supersonic inlets emanating from shock/boundary-layer interactions on the inlet sidewalls, at the inlet throat, and in the subsonic diffuser. Active flow control makes feasible aerodynamic design for high lift/drag ratios at cruise and efficient subsonic/transonic performance at off-design conditions, taking into account environmental and performance constraints. The outcome is a reduction in overall drag of the vehicle, alleviation of unsteady loads and prevention of the expulsion of the inlet shock system (that may lead to catastrophic loss of the airframe).

It is known to use a synthetic jet (also termed a zero net mass flux jet) to influence the flow over a surface, for example to control flow separation from an airfoil. An isolated synthetic jet is produced by the interactions of a train of vortices that are typically formed by alternating momentary ejection and suction of fluid through an orifice of an actuator. A typical synthetic jet actuator (SJA) comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Various volume changing mechanisms are known, for example a piston positioned in the jet housing to move so that fluid is moved in and out of the orifice during reciprocation of the piston, or a flexible diaphragm as a wall of the housing. The flexible diaphragm is typically actuated by a piezoelectric actuator or other appropriate means.

A conventional SJA configuration is shown in FIGS. 1(a) and 1(b). The conventional art SJA 10 comprises a metal cylinder 12 with an active diaphragm 14 on the bottom, and a passive diaphragm 16 on the top. In the center of the top diaphragm is a circular inlet/outlet orifice 18. The active diaphragm comprises a unimorph that in turn comprises a thin strip of piezoelectric material (e.g., ceramic) bonded to a strip of metal (e.g., brass). Electrodes are positioned on either side of the strip of piezoelectric material in order to apply a voltage (the connections to the electrodes and the power source are not illustrated in FIG. 1).

When voltage is not applied to the active diaphragm, the active diaphragm is substantially flat as shown in FIG. 1(a). When a voltage is applied to the active diaphragm, the active diaphragm flexes upward as shown in FIG. 1(b). This upward flexing of the active diaphragm reduces the volume of the chamber and causes air to be jetted out (as illustrated by the dashed arrow). For the conventional SJA, a negative transverse strain mode is used in the diameter direction of the piezoelectric diaphragm. This limits the displacement of the bottom diaphragm for two reasons: (1) piezoelectric transverse strain in ceramics and single crystals is about half of its longitudinal strain; and (2) the negative transverse strain induces the ceramic component to shrink along its diameter direction, reducing the flexing displacement of the diaphragm.

In the past a few years, a number of computational fluid dynamics studies have indicated that SJAs have the potential to be used for active flow control in supersonic, hypersonic, and subsonic vehicles. A number of theoretical studies indicate that the synthetic jet actuator is one of the most efficient devices for flow control. According to these studies, the interaction of synthetic jets with an external cross flow over the surface on which they are mounted can displace the local streamlines and can induce an apparent or virtual change in the shape of the surface, thereby effecting flow changes on length scales that are one to two orders of magnitude larger than the characteristic scale of the jets. Global control of the aircraft will be enhanced, using this new-generation control structure. A number of experimental studies have demonstrated this effect, but they have shown that jet velocity is not high enough to be used at supersonic speeds. Unfortunately, the jet velocity and mass flow rate of currently existing SJAs are not high enough to meet the needs of active dynamic controls for space missions. In today's technological climate, there is a strong impetus to develop piezoelectric synthetic jet actuators with jet velocities of over 150 meters per second (m/s) at non-resonance working mode.

BRIEF SUMMARY OF THE INVENTION

The advanced high performance vertical hybrid electroactive synthetic jet actuator (ASJA-V) is a synthetic jet actuator with three-dimensional active walls synergistically cooperating with each other, utilizing the positive and negative strains of the electroactive materials in different directions. The novel ASJA-V can provide active aerodynamic control for supersonic, hypersonic, and subsonic fixed wing aircraft and subsonic rotary wing aircraft.

In one embodiment of the invention, a synthetic jet actuator comprises an electroactive cylindrical wall, a first end electroactive diaphragm, and a second end electroactive diaphragm. The first and second end electroactive diaphragms are joined to the electroactive cylindrical wall at opposing ends of the electroactive cylindrical wall such that the formed chamber has a closed cylinder shape. The electroactive cylindrical wall defines the orifice therethrough. The orifice may have a generally frustoconical shape The electroactive cylindrical wall may comprise multiple layers of electroactive material. The first and second end electroactive diaphragms each may comprise a layer of electroactive material bonded to a layer of metal. The electroactive material layer may comprise multiple concentric cylinders of electroactive material. The first and second end electroactive diaphragms are typically sized such that at least the electroactive material layer fits within the electroactive cylindrical wall. A flexible sealer is typically disposed between the electroactive material layer and the electroactive cylindrical wall.

The positive strain and negative strain of the electroactive cylindrical wall are typically configured such that, when voltage is applied to the electroactive cylindrical wall, (i) a height of the electroactive cylindrical wall decreases, (ii) a thickness of the electroactive cylindrical wall increases, (iii) an inner diameter of the electroactive cylindrical wall decreases, and (iv) a diameter of the orifice decreases. The positive strain or negative strain of the first and second end electroactive diaphragms are typically configured such that, when voltage is applied to the first and second end electroactive diaphragms, a potential increase in a diameter of each electroactive diaphragm is restricted by the electroactive cylindrical wall, thereby causing a center of each electroactive diaphragm to flex toward the other electroactive diaphragm. The flexing of the first and second end electroactive diaphragms toward each other may be further enhanced by the decrease of the inner diameter of the electroactive cylindrical wall.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 1(a) and (b) are simplified cross-sectional schematic views of a conventional art synthetic jet actuator.

Figure 3:
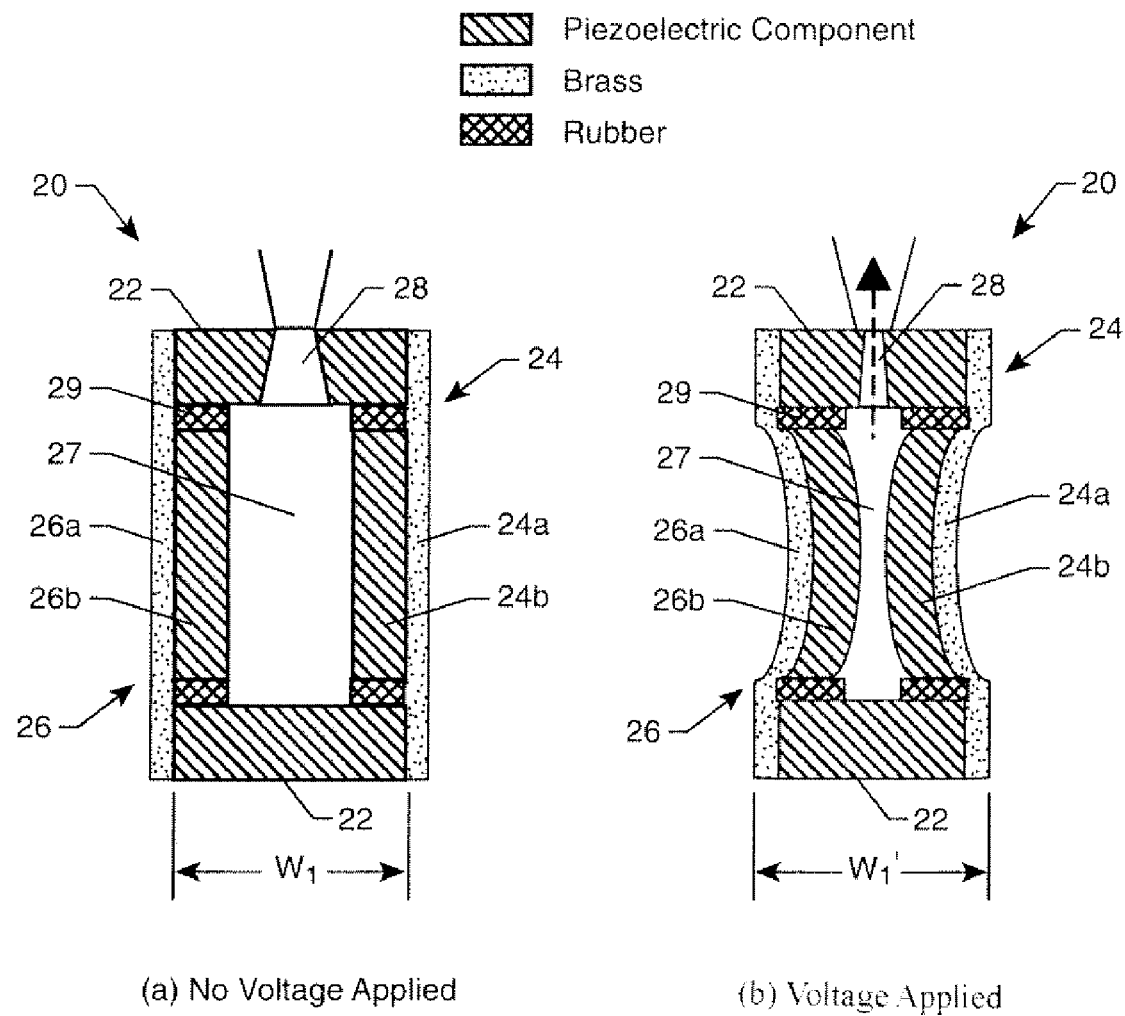
Figure 5:
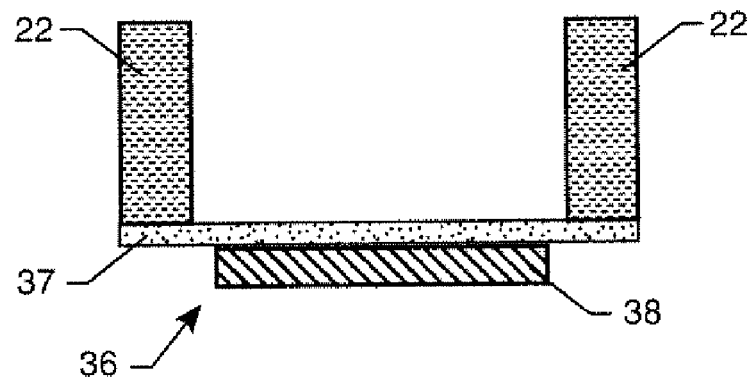
Figure 5:
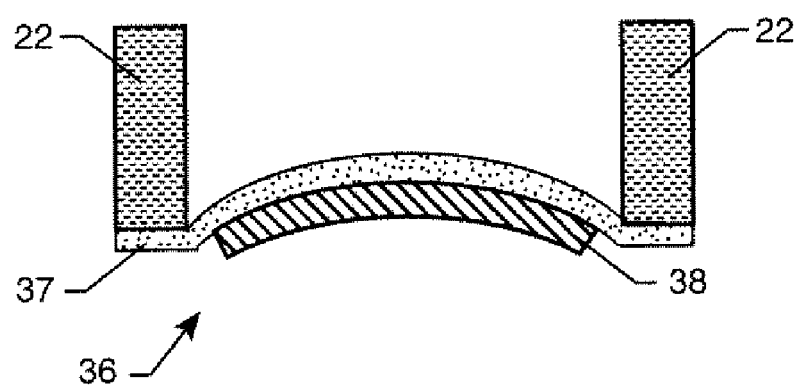
Figure 6:
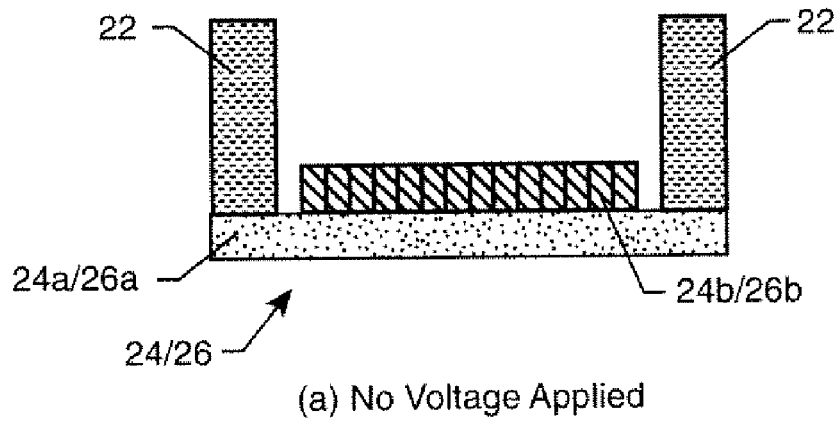
Figure 6:
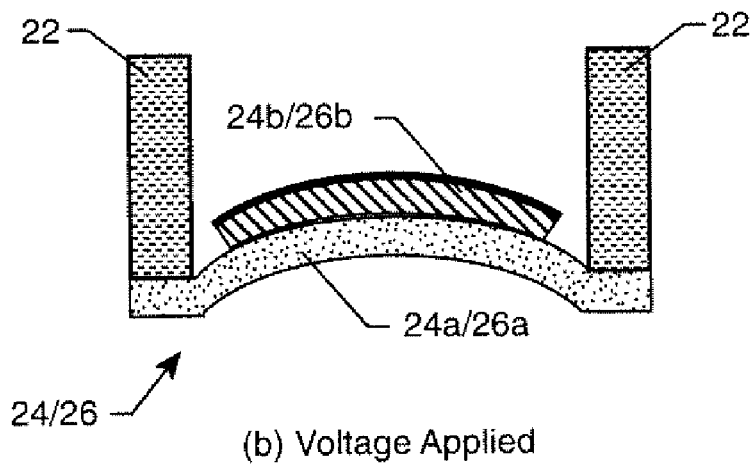
Figure 6:
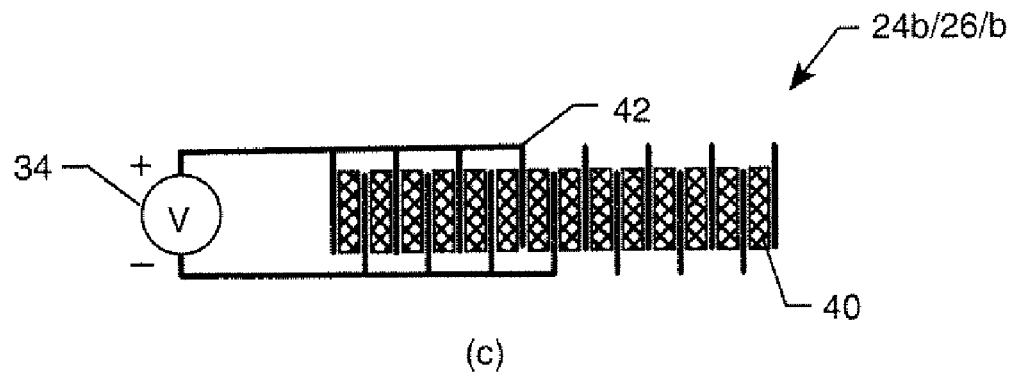
Figure 7:
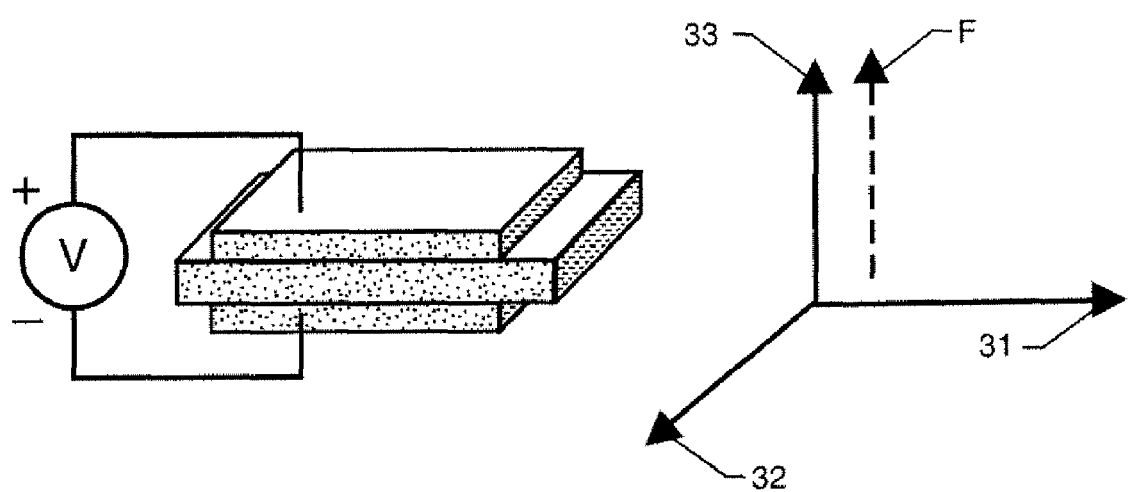

FIG. 2 is a side perspective view an advanced high performance vertical hybrid electroactive synthetic jet actuator (ASJA-V), in accordance with embodiments of the present invention;

FIGS. 3(a) and (b) are simplified cross-sectional schematic views of the ASJA-V of FIG. 2;

FIGS. 4(a) and (b) are more detailed cross-sectional schematic views of a portion of the electroactive cylindrical wall of the ASJA-V of FIG. 2;

FIGS. 5(a) and (b) are more detailed cross-sectional schematic views of the first and second end electroactive diaphragms of the ASJA-V of FIG. 2 in accordance with one embodiment of the invention;

FIGS. 6(a), (b), and (c) are more detailed cross-sectional schematic views of the first and second end electroactive diaphragms of the ASJA-V of FIG. 2 in accordance with an alternate embodiment of the invention; and FIG. 7 illustrates the characteristics of electromechanical response in electroactive materials.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Synthetic jet actuators of embodiments of the invention comprise a plurality of walls forming a chamber, where each of the plurality of walls comprises electroactive material. By having all of the walls comprise electroactive material, upon application of a voltage to all of the walls the size of the chamber is reduced in all three dimensions. This three-dimensional reduction in the size of the chamber causes a much greater reduction of reservoir volume as compared to conventional SJA. Embodiments of the invention will be described herein in which the synthetic jet actuators of embodiments of the invention have generally a closed cylinder shape (with the walls forming a chamber and at least one wall defining an orifice).

FIG. 2 illustrates a side perspective view an advanced high performance vertical hybrid electroactive synthetic jet actuator (ASJA-V) 20 in accordance with embodiments of the present invention. FIGS. 3(a) and (b) illustrate simplified cross-sectional schematic views of the ASJA-V 20. FIG. 3(a) illustrates the ASJA-V when no voltage is applied, and FIG. 3(b) illustrates the ASJA-V when a voltage is applied. The ASJA-V comprises a generally cylindrical device with three electroactive components—an electroactive multilayer cylinder 22, a first end electroactive diaphragm 24, and a second end electroactive diaphragm 26. As seen in FIGS. 2, 3(a) and 3(b), the first and second end electroactive diaphragms 24, 26 are joined to the electroactive cylindrical wall 22 at opposing ends of the electroactive cylindrical wall to form a closed cylinder shape that defines a chamber or reservoir 27. The electroactive cylinder 22 defines an orifice 28 therethrough that is located at approximately the center of the cylinder (i.e., midway between the two diaphragms along a longitudinal axis). The orifice typically has a generally frustoconical shape (such that the top and bottom openings are circular) or frustopyramidal shape (such that the top and bottom openings are square or rectangular). The electroactive components are constructed of, for example, piezoelectric material such as ceramic or crystal, and may be multilayer or single layer. The first and second end diaphragms 24, 26 each comprise an electroactive layer 24b, 26b bonded to a metal (e.g., brass) layer 24a, 26a. The electroactive components will be described in further detail below. The device is assembled with resin. In order to allow the first and second end diaphragms the freedom to bend in order to reduce the reservoir volume, a flexible sealer 29 (e.g., rubber) is used to fill the space between the cylinder and the diaphragms.

The deformations of the three electroactive walls of the ASJA-V are hybrid in order to obtain maximum changes of the jet reservoir volume and the diameter of the jet orifice. For each cycle, the change of reservoir volume of the ASJA-V is over five times greater than that of a conventional SJA (which has only one electroactive component—a negative strain-based bottom piezoelectric diaphragm). This much greater reservoir volume change provided by the novel structure of the present invention improves the mass flow rate so that it is many times greater than that of a conventional SJA. Simultaneously, the reduction of the orifice (inlet/outlet) diameter produces a higher jet velocity when the volume of the reservoir is actively reduced. The ASJA-V concept has a much higher performance than the conventional SJA because of the three-dimensional active motion of the device walls. Due to the physical structure and dimensions of the ASJA-V, the ASJA-V may be favorable for the case in which the height of the SJA is not critical.

FIGS. 4(a) and (b) are more detailed cross-sectional schematic views of a portion of the electroactive cylindrical wall of the ASJA-V when viewed along line A-A in the direction of the arrows in FIG. 2. FIG. 4(a) illustrates the ASJA-V when no voltage is applied, and FIG. 4(b) illustrates the ASJA-V when a voltage is applied. The positive strain and negative strain of the electroactive cylinder are configured such that, when a voltage is applied across the wall of the electroactive cylinder of the ASJA-V (along it diameter direction): (i) the thickness $((D_2-D_1)/2)$ of the cylinder wall increases; (ii) the length of the cylinder decreases; (iii) the inside diameter $(D_1)$ and the outside diameter $(D_2)$ of the cylinder decrease (to $D_1'$ and $D_2'$ respectively); (iv) the diameters of the first and second end diaphragms decrease; and (v) the external diameter and the internal diameter of the orifice decreases.

Figure 4:
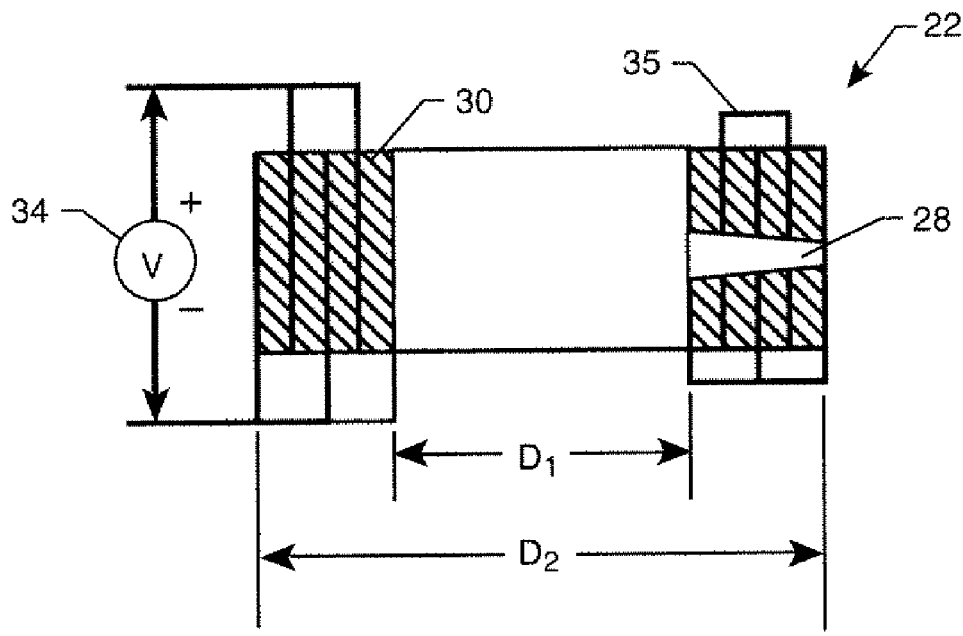
Figure 4:
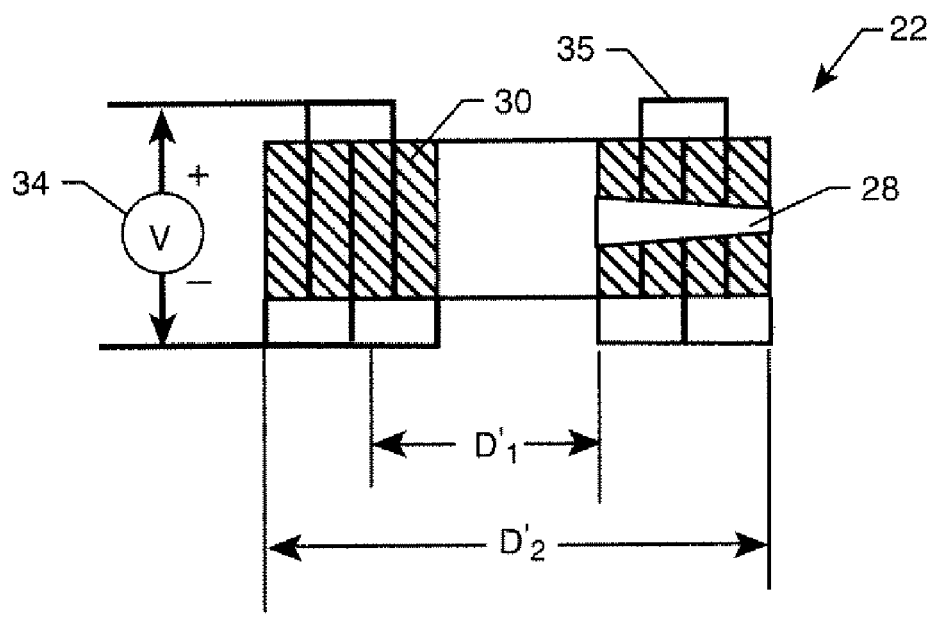

The embodiment illustrated in FIG. 4 has a multilayer cylindrical wall, in that multiple concentric (nested) layers 30 of electroactive material are bonded together to form the cylinder. The cylindrical wall 22 is illustrated in FIG. 4 with four concentric layers of electroactive material, but a larger or smaller number of layers may be used as desired. Each opposing inner and outer side of each layer contacts an electrical conductor layer 35. Two of the conductors (the outermost conductor and the innermost conductor) contact only one electroactive layer, while the remaining conductors are positioned between electroactive layers and therefore contact the two electroactive layers between which the conductor lies. Each conductor is electrically connected to a voltage source 34 (alternating ones of the conductors are electrically connected to the positive terminal of the voltage source or to the negative terminal of the voltage source). The advantages of the multilayer sandwich are to reduce the applied voltage requirement, achieve high deformation, and maintain a high blocking force (load capability).

The first and second end electroactive diaphragms can be either a negative transverse strain based diaphragm (substantially the same as the diaphragm in the conventional SJA of FIG. 1), as shown in FIGS. 5(a) and (b), or a multilayer electroactive cylinder based ceramic-metal unimorph diaphragm as shown in FIGS. 6(a)-(c). Even for the conventional negative transverse strain based diaphragm, the flexing will be also greater than a same diaphragm in a conventional ASJ when a same voltage is applied since the decreasing diameter of the cylinder chamber increases the flexing motion of the diaphragm.

Referring now to FIGS. 5(a) and (b), more detailed cross-sectional schematic views of the conventional electroactive diaphragm (as may be used for the first and second end electroactive diaphragms in one embodiment of the invention) are illustrated. FIG. 5(a) illustrates the electroactive diaphragm when no voltage is applied, and FIG. 5(b) illustrates the electroactive diaphragm when a voltage is applied. The diaphragm 36 of FIGS. 5(a) and (b) comprises a metal plate 37 and an electroactive layer 38 bonded to the outer side (i.e., the side opposite the chamber) of the metal plate. For clarity, the conductors on opposing sides of the electroactive layer are not illustrated. When a voltage is applied along its thickness direction, the diameter of the electroactive layer attempts to decrease. This decrease of the diameter of the electroactive layer makes the entire diaphragm flex upward into a curved shape, due to the reaction between the metal layer and the electroactive layer, as shown in FIG. 5(b). Because of the decrease of the diameter of the electroactive layer, the overall force of the electroactive layer acting on the metal layer is equivalent to a uniform force (pressure) applied from the downside to the upside—thereby causing the upward flex. The portion of the metal layer which is bonded to the electroactive layer either slightly increases or slightly decreases along the diameter direction (depending the design), while the portion of the metal layer that is not bonded to the electroactive layer increases more along the diameter direction. The different reactions of the different portions of the metal layer are desirable, which is why the diameter of the electroactive layer is smaller than the diameter of the metal layer. The diameter of the electroactive layer is smaller than the inner diameter of the cylinder to enable the diaphragm to flex to get optimized deformation.

Referring now to FIGS. 6(a), (b), and (c), more detailed cross-sectional schematic views of the first and second end multilayer electroactive diaphragms (of an alternate embodiment from that illustrated in FIGS. 5(a) and (b)) are illustrated. FIG. 6(a) illustrates the electroactive diaphragm when no voltage is applied, and FIG. 6(b) illustrates the electroactive diaphragm when a voltage is applied. The diaphragm 24, 26 of FIGS. 6(a) and (b) comprises a metal plate 24a, 26a and a multilayer electroactive layer 24b, 26b bonded to the inner side (i.e., the side toward the chamber) of the metal plate. For clarity, the conductors between the multiple layers are not illustrated in FIGS. 6(a) and (b). When a voltage is applied along its diameter direction, the diameter of the electroactive layer attempts to increase. However, the potential increase in diameter is restricted by the cylindrical wall. This restricted potential increase in diameter makes the entire diaphragm flex upward into a curved shape as shown in FIG. 6(b). Since the longitudinal strain is two times larger than the transverse strain for the same electric field, the flexing displacement is $2^{0.5}$ times the flexing displacement of the conventional horizontal SJA shown in FIG. 1(b).

The multilayer electroactive layer 24b, 26b is formed with a plurality of concentric (nested), thin, short cylinders 40. Any desired number of layers or cylinders may be used. As illustrated in FIG. 6(c), each opposing inner and outer side of each layer 40 contacts an electrical conductor layer 42. Two of the conductors (the outermost conductor and the innermost conductor) contact only one electroactive layer, while the remaining conductors are positioned between electroactive layers and therefore contact the two electroactive layers between which the conductor lies. Each conductor is electrically connected to a voltage source 34 (alternating ones of the conductors are electrically connected to the positive terminal of the voltage source or to the negative terminal of the voltage source). The diameter of the electroactive layer is smaller than the inner diameter of the cylinder to enable the diaphragm to flex, and the electroactive layer is positioned within the cylinder wall 22. In order to allow the end diaphragms freedom to flex and to reduce the reservoir volume, a flexible sealer (e.g., rubber) (illustrated in FIG. 2 but not in FIG. 6) is used to fill the space between the inner wall of the cylinder 22 and the electroactive layer 24b, 26b of the diaphragm.

The ASJA-V of embodiments of the invention can be used in broad areas of dynamic control. Each aircraft needs several dozen of this kind of device for local aerodynamic control. In addition, underwater facilities also need this kind of device for control and detection.

In one exemplary embodiment, an ASJA-V is constructed having physical dimensions as indicated in Table 1.

TABLE 1

| Components | Dimension | Value (mm) |
| --- | --- | --- |
| Piezoelectric multilayer cylinder | Internal diameter | 50 |
| | External diameter | 60 |
| | Height | 8 |
| Orifice of cylinder | Inside diameter | 4.0 |
| | Outside diameter | 2.0 |
| Piezoelectric layer of diaphragms | Diameter | 46 |
| | Thickness | 2 |
| | Thickness of a single cylinder layer | 0.5 |
| Brass plate of diaphragms | Diameter | 60 |
| | Thickness | 0.1 |

In order to optimize the design of the present ASJA-V, it is desirable to study the characteristics of the electromechanical response in electroactive ceramics/single crystals first as illustrated in FIG. 7. For a piezoelectric material (which, as illustrated in FIG. 7, is bonded to conductors on opposing sides to enable a voltage to be applied to the material), the electric field direction is depicted by the dashed arrow labeled "E." The electric field induces a strain in direction 33 that is parallel to the electric field direction, and this strain is termed a longitudinal strain and is referred to as $S_{33}$. The electric field also induces strains in the two directions 31, 32 that are perpendicular to the electrical field directions, and these strains are termed called transverse strains and are referred to as $S_{31}$ and $S_{32}$. For inorganic piezoelectric materials, such as ceramics or single crystals, the longitudinal strains are positive and the transverse strains are negative. Normally, $S_{33} \approx -2S_{31} \approx -2S_{32}$. With different multilayer configurations, one can obtain a special component which can offer either positive or negative strain in a certain direction to form a hybrid actuation system.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A synthetic jet actuator comprising:
an electroactive cylindrical wall;
a first end electroactive diaphragm; and
a second end electroactive diaphragm;
wherein the first and second end electroactive diaphragms are joined to the electroactive cylindrical wall at opposing ends of the electroactive cylindrical wall such that the formed chamber has a closed cylinder shape; and wherein the electroactive cylindrical wall defines an orifice therethrough; and further wherein a positive strain and a negative strain of the electroactive cylindrical wall are configured such that, when voltage is applied to the electroactive cylindrical wall, (i) a height of the electroactive cylindrical wall decreases, (ii) a thickness of the electroactive cylindrical wall increases, (iii) an inner diameter of the electroactive cylindrical wall decreases, and (iv) a diameter of the orifice decreases.

2. The synthetic jet actuator of claim 1, wherein the electroactive cylindrical wall comprise multiple layers of electroactive material.

3. The synthetic jet actuator of claim 1, wherein the first and second end electroactive diaphragms each comprises a layer of electroactive material bonded to a layer of metal.

4. The synthetic jet actuator of claim 3, wherein the electroactive material layer comprises multiple concentric cylinders of electroactive material.

5. The synthetic jet actuator of claim 3, wherein the first and second end electroactive diaphragms are sized such that at least the electroactive material layer fits within the electroactive cylindrical wall.

6. The synthetic jet actuator of claim 5, wherein a flexible sealer is disposed between the electroactive material layer and the electroactive cylindrical wall.

7. The synthetic jet actuator of claim 1, wherein a positive strain or a negative strain of the first and second end electroactive diaphragms are configured such that, when voltage is applied to the first and second end electroactive diaphragms, a potential increase of a diameter of each electroactive diaphragm is restricted by the electroactive cylindrical wall, thereby causing a center of each electroactive diaphragm to flex toward the other electroactive diaphragm, and
wherein the decrease of the inner diameter of the electroactive cylindrical wall further enhances the flexing of the first and second end electroactive diaphragms toward each other.

8. The synthetic jet actuator of claim 1, wherein the orifice has a generally frustoconical shape.

* * * * *